(12) United States Patent
Zhang et al.

(10) Patent No.: US 10,140,911 B2
(45) Date of Patent: Nov. 27, 2018

(54) SHIFT REGISTER UNIT AND DRIVING METHOD, GATE DRIVE CIRCUIT, AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Xiaoxiang Zhang, Beijing (CN); Zheng Liu, Beijing (CN); Mingxuan Liu, Beijing (CN); Huibin Guo, Beijing (CN); Xi Chen, Beijing (CN)

(73) Assignees: BOE TECHNOLOGY GROUP CO., LTD., Fremont, CA (US); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 79 days.

(21) Appl. No.: 15/508,608

(22) PCT Filed: Sep. 22, 2016

(86) PCT No.: PCT/CN2016/099707
§ 371 (c)(1),
(2) Date: Mar. 3, 2017

(87) PCT Pub. No.: WO2017/148137
PCT Pub. Date: Sep. 8, 2017

(65) Prior Publication Data
US 2018/0144677 A1    May 24, 2018

(30) Foreign Application Priority Data
Mar. 2, 2016   (CN) .......................... 2016 1 0118018

(51) Int. Cl.
*G09G 3/20* (2006.01)
*G11C 19/28* (2006.01)

(52) U.S. Cl.
CPC ............ *G09G 3/2092* (2013.01); *G09G 3/20* (2013.01); *G11C 19/28* (2013.01);
(Continued)

(58) Field of Classification Search
CPC ............... G09G 3/2092; G09G 3/3266; G09G 2310/0254; G09G 2310/0267;
(Continued)

(56) References Cited

U.S. PATENT DOCUMENTS 8,842,061 B2 * 9/2014 Chen ...................... G11C 19/28
345/100
9,208,737 B2   12/2015 Hong et al.
(Continued)

FOREIGN PATENT DOCUMENTS

CN    102254503 A    11/2011
CN    103198781 A     7/2013
(Continued)

OTHER PUBLICATIONS

International Search Report & Written Opinion dated Dec. 19, 2016 regarding PCT/CN2016/099707.
(Continued)

*Primary Examiner* — Tom Sheng
(74) *Attorney, Agent, or Firm* — Intellectual Valley Law, P.C.

(57) ABSTRACT

The present application discloses a shift register unit for outputting a gate driving signal to control image display in an operation cycle including sequentially an input phase, an output phase, an output-suspending phase, the shift register unit including a first node-control circuit connected to a pull-up node and a first pull-down node; a second node-control circuit connected to a pull-down control node and the pull-up node; a pull-up circuit connected to the pull-up node, a first input terminal for receiving a first clock signal,
(Continued)

and an output terminal for outputting the gate driving signal, and configured to control the first clock signal to be passed from the first input terminal to the output terminal when the pull-up node is at a first potential level; a third node-control circuit connected to the pull-up node, the first pull-down node, the pull-down control node, and a second input terminal for receiving a second clock signal; and configured to control the first pull-down node to receive the second clock signal from the second input terminal when the pull-down control node is at the first potential level; a first pull-down circuit connected to the first pull-down node and the output terminal to control a second potential level to be passed to the output terminal when the first pull-down node is at the first potential level; a fourth node-control circuit connected to a second pull-down node and the pull-down control node to control the second pull-down node at the second potential level during the input phase and the output phase and to maintain an inverted potential level between the second pull-down node and the first pull-down node during the output-suspending phase; and a second pull-down circuit connected to the second pull-down node and the output terminal to yield a second potential level at the output terminal when the second pull-down node is at the first potential level, the first node-control circuit being further connected to the second pull-down node to control the pull-up node at the second potential level when the second pull-down node is at the first potential level.

20 Claims, 8 Drawing Sheets

(52) U.S. Cl.
CPC ............... *G09G 2310/0254* (2013.01); *G09G 2310/0267* (2013.01); *G09G 2310/0278* (2013.01); *G09G 2310/0286* (2013.01); *G09G 2310/08* (2013.01)

(58) Field of Classification Search
CPC ... G09G 2310/0278; G09G 2310/0286; G09G 2310/08; G11C 19/28
See application file for complete search history.

(56) References Cited

U.S. PATENT DOCUMENTS

| | | | |
|---|---|---|---|
| 9,953,611 B2* | 4/2018 | Wang | G09G 5/003 |
| 2001/0015712 A1 | 8/2001 | Hashimoto | |
| 2006/0145999 A1* | 7/2006 | Cho | G11C 19/00 345/100 |
| 2011/0286572 A1 | 11/2011 | Shang et al. | |
| 2015/0255034 A1 | 9/2015 | Hong et al. | |
| 2015/0302935 A1 | 10/2015 | Zeng et al. | |
| 2016/0055814 A1* | 2/2016 | Yang | G09G 3/3677 345/213 |
| 2016/0133337 A1 | 5/2016 | Gu | |

FOREIGN PATENT DOCUMENTS

| | | |
|---|---|---|
| CN | 103985343 A | 8/2014 |
| CN | 104252853 A | 12/2014 |
| CN | 104332146 A | 2/2015 |
| CN | 104700812 A | 6/2015 |
| JP | 2001228817 A | 8/2001 |

OTHER PUBLICATIONS

First Office Action in the Chinese Patent Application No. 201610118018.0, dated Sep. 30, 2017; English translation attached.

* cited by examiner

SHIFT REGISTER UNIT AND DRIVING METHOD, GATE DRIVE CIRCUIT, AND DISPLAY APPARATUS

CROSS-REFERENCE TO RELATED APPLICATION

This application is a national stage application under 35 U.S.C. § 371 of International Application No. PCT/CN2016/099707, filed Sep. 22, 2016, which claims priority to Chinese Patent Application No. 201610118018.0, filed Mar. 2, 2016, the contents of which are incorporated by reference in the entirety.

TECHNICAL FIELD

The present invention relates to a field of displaying, more particularly to a shift register unit and driving method, a gate drive circuit, and a display apparatus.

BACKGROUND

An image display apparatus uses a driver to control image display in each of a plurality of pixels arranged in a matrix configuration. The driver is a transistor-based circuit including a gate driving circuit and a data driving circuit. The gate driving circuit is primarily formed by cascading multiple shift register units, each of which outputs a gate driving signal to one of a plurality of gate lines for controlling a row of pixel transistors. The gate driving signals from the gate driving circuit scan from one gate line to another to control one row of pixel transistors to another row of pixel transistors to on or off states accordingly for image display.

When the output terminal is maintained in a temporary off state during an output-suspending phase of a gate driving process using a conventional gate on array (GOA), the gate driving signal and a pull-up node voltage are often affected by a high potential level of a clock signal due to coupling capacitance between an input terminal of the clock signal and the pull-up node, resulting in a higher noise-to-signal ratio. When the image display apparatus works in a relatively high-temperature working condition, the high noise-to-signal ratio issue becomes even more severe due to a higher threshold voltage shift of the driving transistor in higher temperature ranges.

SUMMARY

In one aspect, the present invention provides a shift register unit for outputting a gate driving signal to control image display in an operation cycle including sequentially an input phase, an output phase, an output-suspending phase, the shift register unit comprising a first node-control circuit connected to a pull-up node and a first pull-down node; a second node-control circuit connected to a pull-down control node and the pull-up node; a pull-up circuit connected to the pull-up node, a first input terminal for receiving a first clock signal, and an output terminal for outputting the gate driving signal, and configured to control the first clock signal to be passed from the first input terminal to the output terminal when the pull-up node is at a first potential level; a third node-control circuit connected to the pull-up node, the first pull-down node, the pull-down control node, and a second input terminal for receiving a second clock signal; and configured to control the first pull-down node to receive the second clock signal from the second input terminal when the pull-down control node is at the first potential level; a first pull-down circuit connected to the first pull-down node and the output terminal to control a second potential level to be passed to the output terminal when the first pull-down node is at the first potential level; a fourth node-control circuit connected to a second pull-down node and the pull-down control node to control the second pull-down node at the second potential level during the input phase and the output phase and to maintain an inverted potential level between the second pull-down node and the first pull-down node during the output-suspending phase; and a second pull-down circuit connected to the second pull-down node and the output terminal to yield a second potential level at the output terminal when the second pull-down node is at the first potential level, wherein the first node-control circuit is further connected to the second pull-down node to control the pull-up node at the second potential level when the second pull-down node is at the first potential level.

Optionally, the first node-control circuit is configured to control the pull-up node at the first potential level during the input phase and the output phase, to control the pull-up node at the second potential level during the output-suspending phase, and to control the pull-up node at the second potential level when the first pull-down node is at the first potential level.

Optionally, the third node-control circuit is configured to control the first pull-down node at the second potential level when the pull-up node is at the first potential level and to control the first pull-down node to connected to the second input terminal when the pull-down control node is at the first potential level.

Optionally, the third node-control circuit comprises a sixth transistor having a gate coupled to the pull-up node, a first terminal coupled to the first pull-down node, and a second terminal provided with the second potential level; and a seventh transistor having a gate coupled to the pull-down control node, a first terminal coupled to the second input terminal for receiving the second clock signal, and a second terminal coupled to the first pull-down node.

Optionally, the second node-control circuit is configured to control the pull-down control node at the second potential level when the pull-up node is at the first potential level, and to control the pull-down control node at the first potential level when the pull-up node is at the second potential level, and to connect with the first input terminal for receiving the first clock signal with an inverted phase of the second clock signal.

Optionally, the fourth node-control circuit is connected to the first input terminal for receiving the first clock signal configured to be inverted in phase with the second clock signal, and is configured to control the first clock signal to be passed to the second pull-down node when the pull-down control node is at the first potential level and to control the second pull-down node at the second potential level when the pull-down control node is at the second potential level.

Optionally, the fourth node-control circuit comprises a first transistor having a gate coupled to the pull-down control node, a first terminal coupled to the first input terminal, and a second terminal coupled to the second pull-down node.

Optionally, the second pull-down circuit comprises a second transistor having a gate coupled to the second pull-down node, a first terminal coupled to the output terminal, and the second terminal provided with the second potential level.

Optionally, the first node-control circuit comprises a third transistor having a gate coupled to the second pull-down node, a first terminal coupled to the pull-up node, and a second terminal provided with the second potential level.

Optionally, the second node-control circuit comprises a fourth transistor and a fifth transistor, the fourth transistor having a gate coupled to the pull-up node, a first terminal coupled to the pull-down control node, and a second terminal provided with the second potential level, the fifth transistor having a gate and a first terminal commonly coupled to the second input terminal for receiving the second clock signal and a second terminal coupled to the pull-down control node.

Optionally, ire pull-up circuit comprises an eighth transistor having a gate coupled to the pull-up node, a first terminal coupled to the first input terminal for receiving the first clock signal, and a second terminal coupled to the output terminal for outputting the gate driving signal; and the first pull-down circuit comprises a ninth transistor having a gate coupled to the first pull-down node, a first terminal coupled to the output terminal, and the second terminal provided with the second potential level.

Optionally, the shift register unit further comprises a reset circuit respectively connected to a reset terminal, the pull-up node, and the output terminal, and configured to control the pull-up node and the output terminal to be at the second potential level when the reset terminal is at the first potential level; and an output pull-down circuit respectively connected to the second input terminal, and the output terminal, and configured to control the output terminal for outputting the second potential level when the second clock signal is at the first potential level.

Optionally, the reset circuit comprises a tenth transistor and an eleventh transistor, the tenth transistor having a gate connected to the reset terminal for receiving a reset signal, a first terminal connected to the pull-up node, and a second terminal provided with the second potential level, the eleventh transistor having a gate connected to the reset terminal for receiving the reset signal, a first terminal connected to the output terminal, and a second terminal provided with the second potential.

Optionally, the output pull-down circuit comprises a twelfth transistor having a gate connected to the second input terminal for receiving the second clock signal, a first terminal connected to the output terminal, and a second terminal provided with the second potential level.

Optionally, the first node-control circuit further comprises a thirteenth transistor having a gate and a first terminal commonly provided with a starting signal and a second terminal connected to the pull-up node; a fourteenth transistor having a gate connected to the second input terminal for receiving the second clock signal, a first terminal provided with the starting signal, and a second terminal connected to the pull-up node; a fifteenth transistor having a gate connected to the first pull-down node, a first terminal connected to the pull-up node, and a second terminal provided with the second potential level; and a storage capacitor having a first terminal connected to the pull-up node and a second terminal connected to the output terminal.

In another aspect, the present invention provides a method for driving the shift register unit described herein in an operation cycle including sequentially an input phase, and an output-suspending phase, the method comprising in the input phase, setting the starting signal to a high voltage level to pass the high voltage level to the pull-up node, setting the first clock signal to a low voltage level to be passed from the first input signal to the output terminal, and making the pull-down control node, the first pull-down node, and the second pull-down node at the low voltage level; in the output phase, setting the first clock signal at a high voltage level and the second clock signal with an inverted phase at a low voltage level, bootstrapping the pull-up node to a higher level than the high voltage level achieved in the input phase so as to pass the high voltage level of the first clock signal to the output terminal, and keeping the pull-down control node, the first pull-down node, and the second pull-down node at the low voltage level; and in the output-suspending phase, controlling the second pull-down node potential level to be inverted in phase with the first pull-down node potential level by the pull-down control node controlled by the second node-control circuit, wherein the first pull-down circuit controls the output terminal to output the gate driving signal at a second potential level when the first pull-down node is given a first potential level, wherein the first node-control circuit controls the pull-up node potential level at the second potential level and the second pull-down circuit controls the output terminal to output the gate driving signal at the second potential level when the second pull-down node is given a first potential level.

Optionally, method further comprises controlling the first pull-down node to a second potential level by a third node-control circuit when the pull-up node is given at a first potential level; controlling the first pull-down node to connect with a second input terminal provided with a second clock signal by the third node-control circuit when the pull-up node is at the second potential level; and controlling the pull-up node to the second potential level by the first node-control circuit when the first pull-down node is given the first potential level.

Optionally, the method further comprises setting the reset signal to a high voltage level for a short period in the output-suspending phase to pass a low voltage level to the pull-up node, the second potential level is substantially the low voltage level; and maintaining the first clock signal from the first input terminal and the second clock signal from the second input terminal alternatively at the first potential level and the second potential level with an inverted phase during the output-suspending phase.

In another aspect, the present invention provides a gate driving circuit comprising a plurality of shift register units described herein.

In another aspect, the present invention provides a display apparatus comprising a gate driving circuit described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
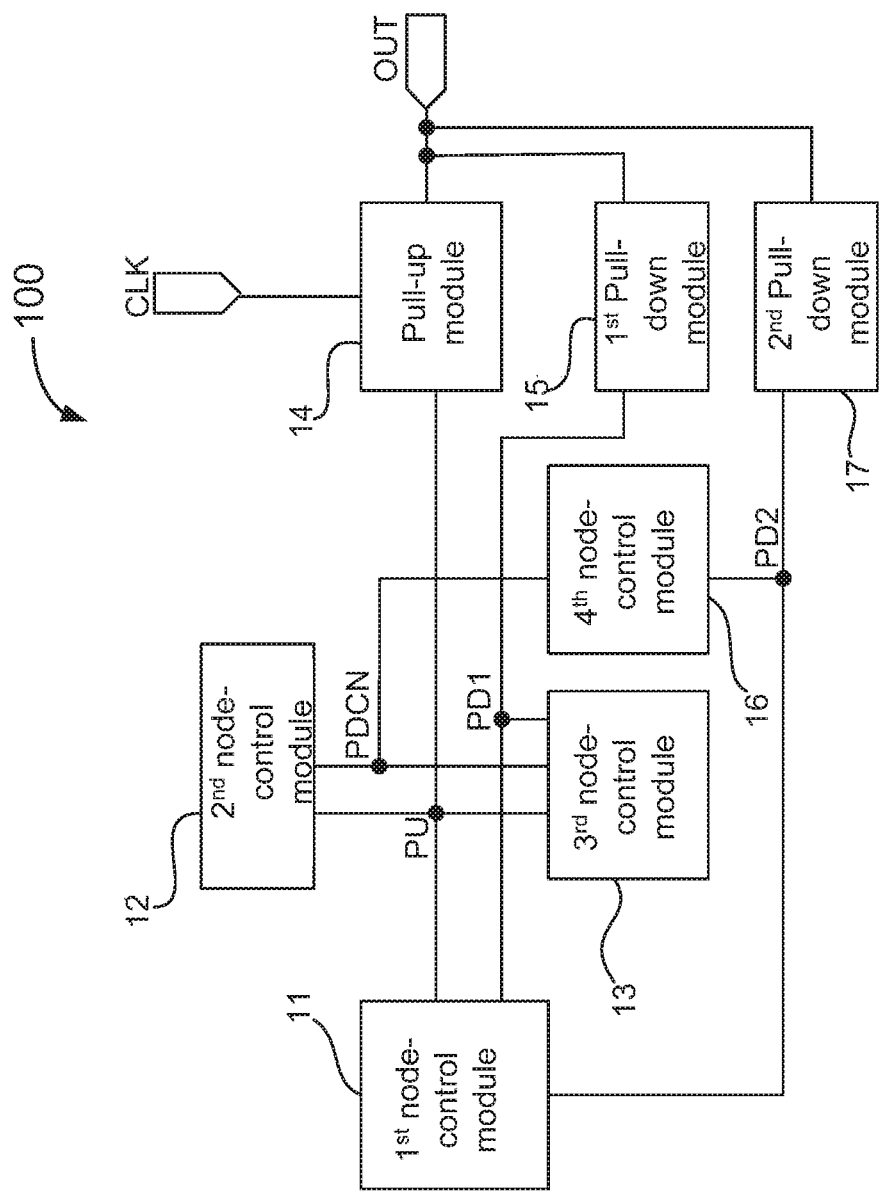
FIG. 1 is a block diagram of a shift register unit according to an embodiment of the present disclosure.

FIG. 1 is a block diagram of a shift register unit according to an embodiment of the present disclosure. In some embodiments, the present disclosure provides a shift register unit 100, as one of multiple units cascaded in series to form a gate driving circuit, to output a gate driving signal for controlling operation of one of a plurality of rows of pixels of a display apparatus such as thin-film transistor-based active-matrix organic light-emitting diode display. Referring to FIG. 1, the shift register unit 100 includes a first node-control circuit 11 for controlling a pull-up node PU. The first node-control circuit 11 is directly connected to the pull-up node PU and a first pull-down node PD1. The shift register unit 100 includes a second node-control circuit 12 for controlling a pull-down control node PDCN. The second node-control circuit 12 is respectively connected to the pull-down control node PDCN and the pull-up node PU. The shift register unit 100 also includes a third node-control circuit 13 for controlling the first pull-down node PD1. The third node-control circuit 13 is connected to the pull-up node PU, the first pull-down node PD1, and the pull-down control node PDCN. Still, the shift register unit 100 includes a pull-up circuit 14 respectively connected to the pull-up node PU, a first input terminal for receiving a first clock signal CLK, and an output terminal OUT for outputting a gate driving signal. The pull-up circuit 14 is configured to control the output terminal OUT to yield the first clock signal CLK when the pull-up node PU is given a first potential level. Additionally, the shift register unit 100 includes a first pull-down circuit 15 respectively connected to the first pull-down node PD1 and the output terminal OUT. The first pull-down circuit 15 is configured to control the output terminal to yield a second potential level (relative to the first potential level) when the pull-up node PU is given the first potential level.

In some embodiments, the first potential level is a high voltage level which is able to turn on one or more n-type transistors used in one or more circuits, for example, the pull-up circuit 14, of the shift register unit for various node potential control and circuit operation. Accordingly the second potential level is a low voltage signal configured to turn the transistor off. Optionally, the first potential level and the second potential level can be selected or given with different voltage values. Those values may vary along with the transistor type or function and/or depend on whether the gate driving signal outputted from the output terminal OUT of the shift register unit is effective for driving pixels for image display as a low voltage signal or as a high voltage signal in different circuit design.

Referring to FIG. 1 again, the shift register unit 100 further includes a fourth node-control circuit 16 for controlling a second pull-down node PD2. The fourth node-control circuit 16 is connected to the second pull-down node PD2 and the pull-down control node PDCN. The fourth node-control circuit 16 is configured to control the potential level at the second pull-down node PD2 during an operation cycle of the shift register unit 100. The potential level at the second pull-down node PD2 is controlled to be at the second potential level during an input phase (or period) and an output phase of the operation cycle under the condition that the potential level at the pull-down control node PDCN is controlled. Alternatively, the potential level at the second pull-down node PD2 is controlled to be inverted from the potential level at the first pull-down node PD1 during an output-suspending phase of the operation cycle.

Further, the shift register unit 100 includes a second pull-down circuit 17 respectively connected to the second pull-down node PD2 and the output terminal for outputting the gate driving signal. The second pull-down circuit 17 is configured to control the output terminal to output the second potential level when the second pull-down node PD2 is given the first potential level. The first node-control circuit 11 also is connected to the second pull-down node PD2 and is used to control the pull-up node PU to be at the second potential level when the second pull-down node PD2 is given the first potential level.

In some embodiments, the present disclosure provides the second pull-down node PD2 in the shift register unit and uses the fourth node-control circuit 16 to control the potential levels respectively at PD2 and PD1 to have an inverted phase. Thus, when the first pull-down node PDT is at the second potential level, the second pull-down node PD2 yields the first potential level. By setting the pull-up node PU to the second potential level controlled by the first node-control circuit 11, the output terminal can be controlled to output a gate driving signal at the second potential level. Therefore, both the potential level at the pull-up node PU and the gate driving signal at the output terminal OUT can be kept at the second potential level during the output-suspending phase so that signal noises on the node PU and OUT can be reduced.

Optionally, the first node-control circuit 11 is used to control the pull-up node PU at the first potential level during the input and output phases and at the second potential level during the subsequent output-suspending phase of each operation cycle of the shift register unit.

Optionally, the first node-control circuit 11 is used to control the pull-up node PU at the second potential when the first pull-down node PD1 is given the first potential level so that the potential level at PD1 is able to effectively turn on one or more corresponding transistors to make them in a conduction state while the potential level at PU is able to effectively turn off one or more corresponding (alternative) transistors to make them in a blocking state.

Figure 2:
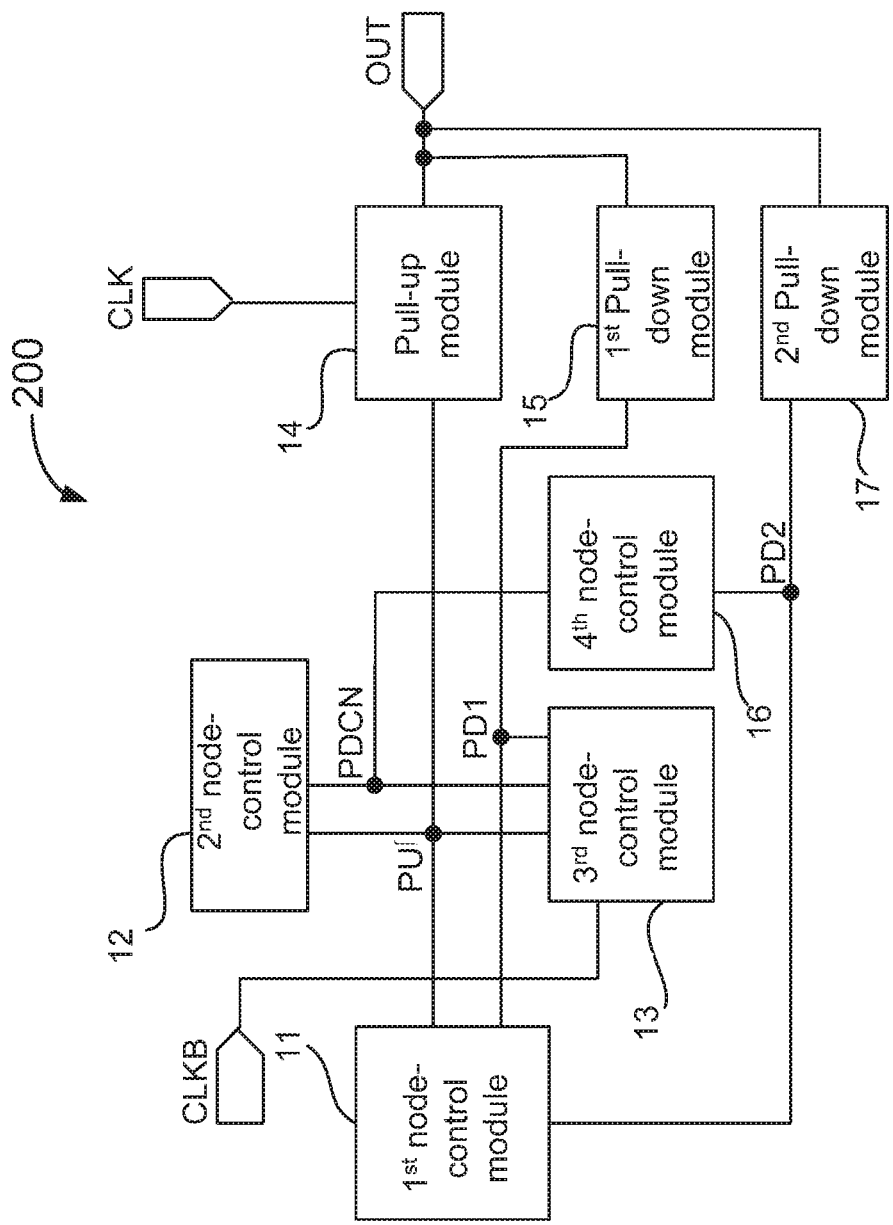
FIG. 2 is a block diagram of a shift register unit according to another embodiment of the present disclosure.

FIG. 2 is a block diagram of a shift register unit according to another embodiment of the present disclosure, in some alternative embodiments, the present disclosure provides a shift register unit 200 configured substantially similar to the shift register unit 100. The third node-control circuit 13 in the shift register unit 200 includes a second input terminal for receiving a second clock signal CLKB. The third node-control circuit 13 is used to control the first pull-down node PD1 at the second potential level when the pull-up node PU is given the first potential level. The third node-control circuit 13 is also able to control the first pull-down node PD1 to receive the second clock signal CLKB from the second input terminal when the pull-down control node PDCN is given the first potential level.

Optionally in the shift register unit 200, the second node-control circuit 12 is configured to control the pull-down control node PDCN at the second potential level when the pull-up node PU is given the first potential level, or inversely, to control the pull-down control node PDCN at the first potential level when the pull-up node PU is given the second potential level.

Figure 3:
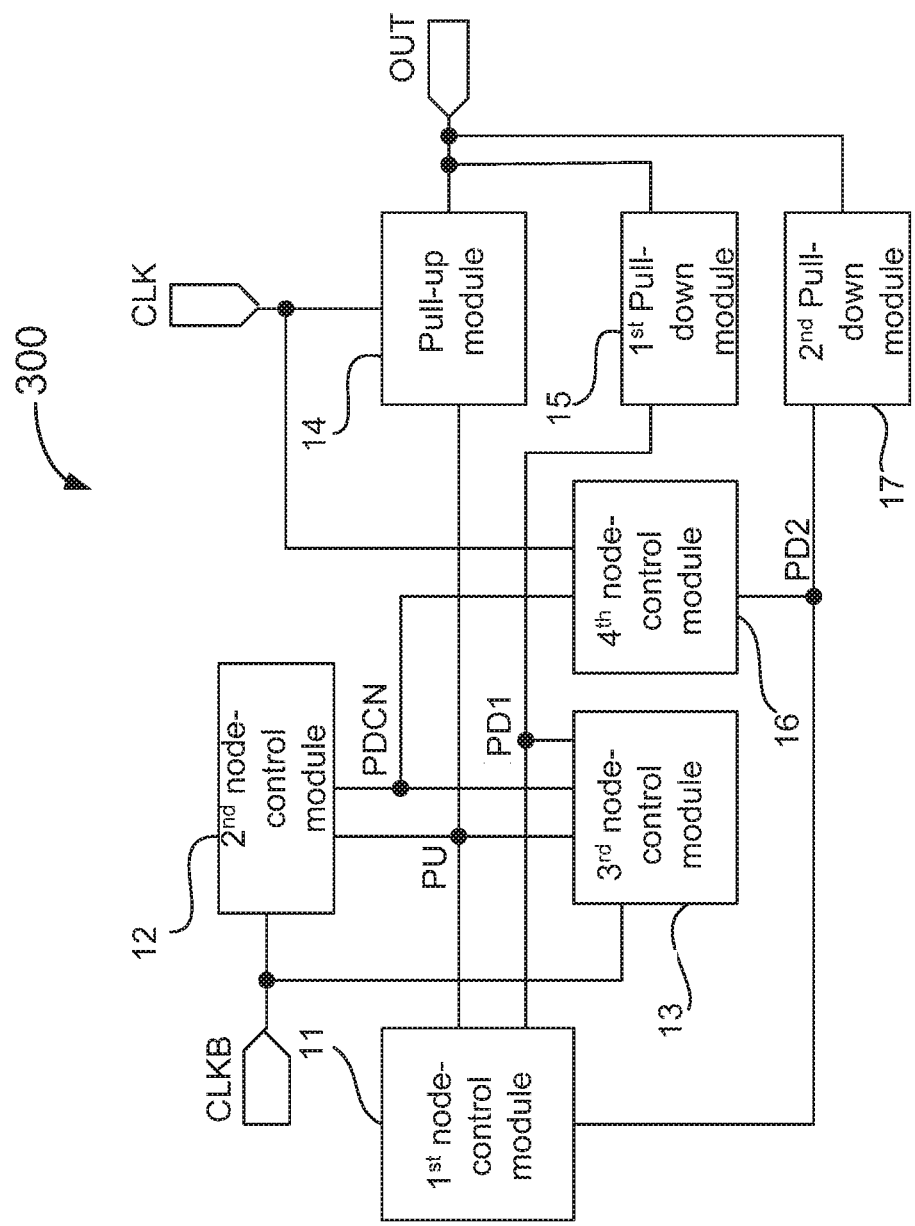
FIG. 3 is a block diagram of a shift register unit according to yet another embodiment of the present disclosure.

FIG. 3 is a block diagram of a shift register unit according to yet another embodiment of the present disclosure. In some alternative embodiments, the present disclosure provides a shift register unit 300 configured substantially similar to the shift register unit 200. The second node-control circuit 12 in the shift register unit 300 is connected to the second input terminal to receive the second clock signal CLKB. The second node-control circuit 12 also is used to control the pull-down control node PDCN to be passed with the second clock signal CLKB when the pull-up node PU is given the second potential level and the second clock signal CLKB is set to the first potential level.

Optionally, the fourth node-control circuit 16 in the shift register unit 300 is also connected to the first input terminal to receive the first clock signal CLK. The first clock signal CLK is set to be inverted in phase compared to the second clock signal CLKB. The fourth node-control circuit 16 thus is configured to control the second pull-down node PD2 to be passed with the first clock signal CLK when the pull-down control node PDCN is given the first potential level, and to control the second pull-down node PD2 at the second potential level when the pull-down control node PDCN is given the second potential level.

Figure 4:
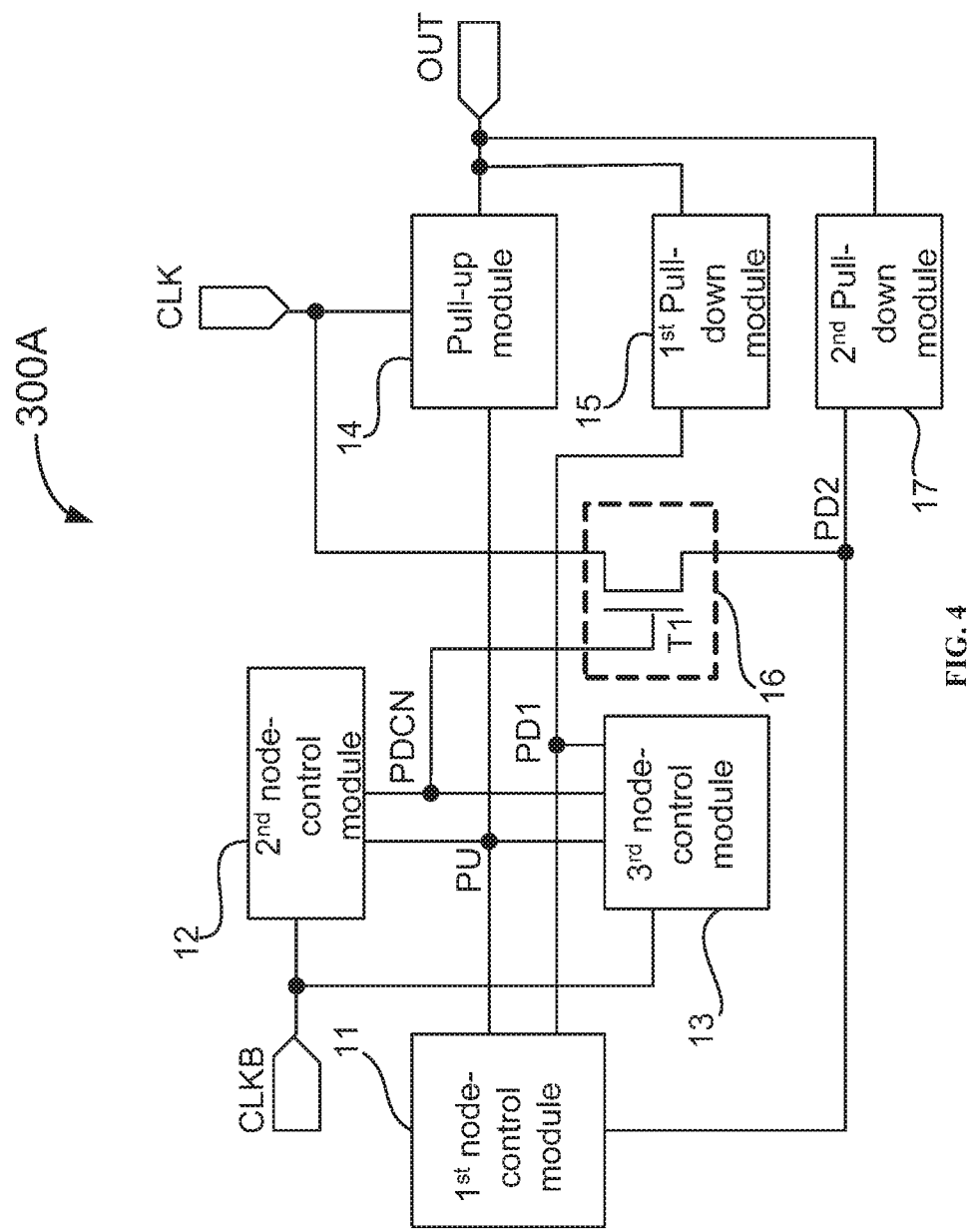
FIG. 4 is a block diagram of a shift register unit according to still another embodiment of the present disclosure.

FIG. 4 is a block diagram of a shift register unit according to still another embodiment of the present disclosure. In some alternative embodiments, the present disclosure provides a shift register unit 300A configured substantially the same as the shift register unit 300. The fourth node-control circuit 16 in the shift register unit 300A includes a first transistor T1. The first transistor T1 has a gate connected to the pull-down control node PDCN, a first terminal connected to the first input terminal for receiving the first clock signal CLK, and a second terminal connected to the second pull-down node PD2.

Optionally, the first transistor T1 is an n-type transistor. When the pull-down control node PDCN is provided with a high voltage turn-on level, T1 is turned into a conduction state so that the second pull-down node PD2 is connected to the first input terminal provided with the first clock signal CLK. Alternatively, the T1 can be a p-type transistor. In this case, a low voltage level at the node PDCN is able to make the T1 in conduction state.

Figure 5:
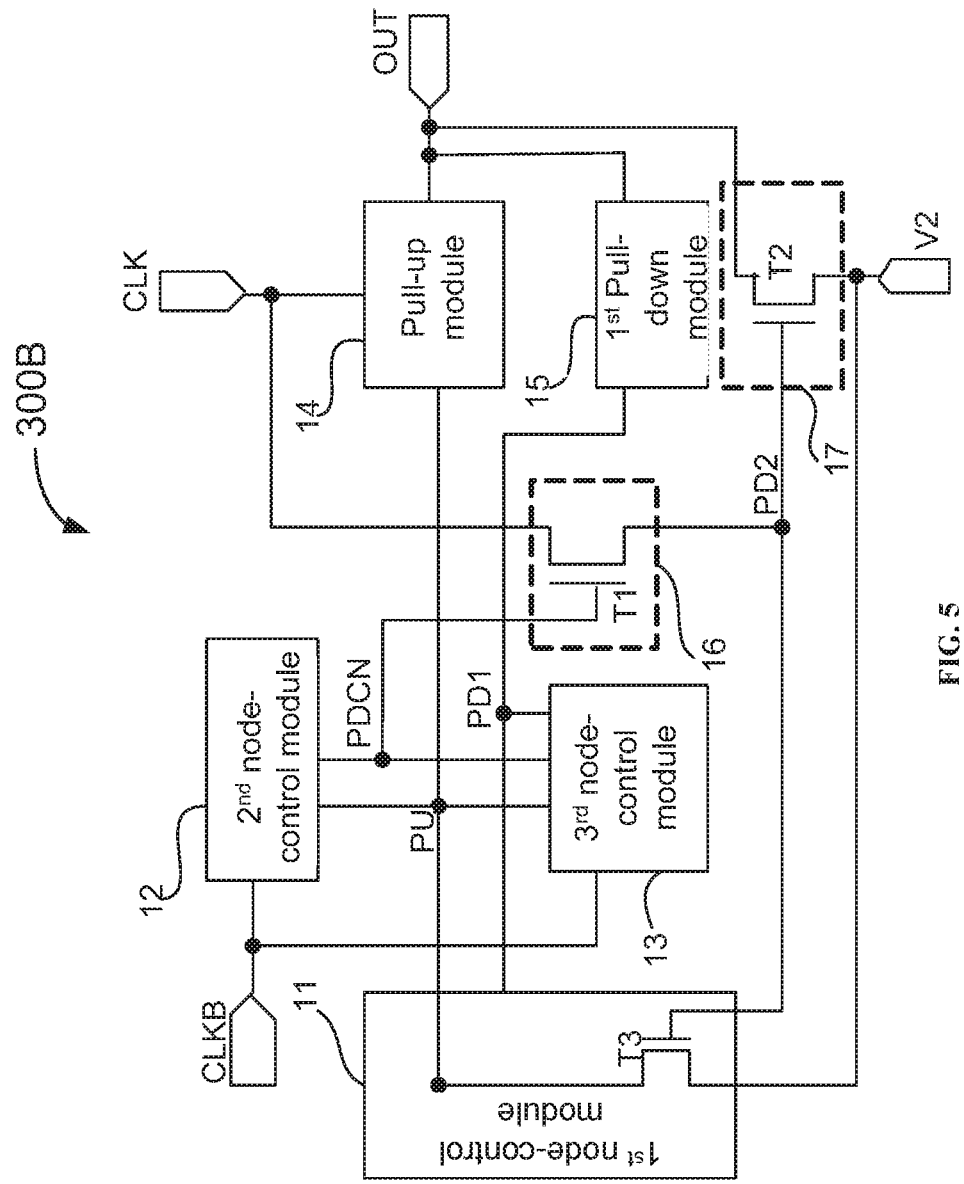
FIG. 5 is a block diagram of a shift register unit according to yet still another embodiment of the present disclosure.

FIG. 5 is a block diagram of a shift register unit according to yet still another embodiment of the present disclosure. In some alternative embodiments, the present disclosure provides a shift register unit 300B configured substantially similar to the shift register unit 300A. The second pull-down circuit 17 in the shift register unit 300B includes a second transistor T2 having a gate coupled to the second pull-down node PD2, a first terminal coupled to the output terminal OUT, and a second terminal provided with a second potential level V2.

Additionally, the first node-control circuit 11 in the shift register unit 300B includes a third transistor T3. T3 has a gate coupled to the second pull-down node PD2, a first terminal coupled to the pull-up node PU, and a second terminal provided with the second potential level V2.

Referring to FIG. 5, transistors T2 and T3 optionally can be all n-type transistors. Thus, a high voltage (turn-on) level at the second pull-down node PD2 makes T2 in a conduction state so that the output terminal OUT outputs a gate driving signal at a high voltage level. The high voltage level at PD2 also makes T3 in a conduction state so that the pull-up node PU receives the second potential level V2 at a low voltage.

Alternatively, transistors T2 and T3 can also be p-type transistors. In this case, a low voltage (turn-on) level at the second pull-down node PD2 will make T2 and T3 in conduction states.

In some embodiments, the second node-control circuit 12 in the shift register unit includes a fourth transistor having a gate coupled to the pull-up node PU, a first terminal coupled to the pull-down control node PDCN, and a second terminal provided with the second potential level V2. The second node-control circuit 12 further includes a fifth transistor having a gate and a first terminal commonly coupled to the second input terminal provided with the second clock signal CLKB and a second terminal coupled to the pull-down control node PDCN.

In some embodiments, the third node-control circuit 13 in the shift register unit includes a sixth transistor having a gate coupled to the pull-up node PU, a first terminal coupled to the first pull-down node PD1, and a second terminal provided with the second potential level V2. The third node-control circuit 13 further includes a seventh transistor having a gate coupled to the pull-down control node PDCN, a first terminal coupled to the second input terminal provided with the second clock signal CLKB, and a second terminal coupled to the first pull-down node PD1.

In some embodiments, the pull-up circuit 14 in the shift register unit includes an eighth transistor having a gate coupled to the pull-up node PU, a first terminal coupled to the first input terminal provided with the first clock signal CLK, and a second terminal coupled to the output terminal OUT for outputting a gate driving signal.

In some embodiments, the first pull-down circuit 15 in the shift register unit includes an ninth transistor having a gate coupled to the first pull-down node PD1, a first terminal coupled to the output terminal OUT for outputting a gate driving signal, and a second terminal provided with the second potential level V2.

Figure 6:
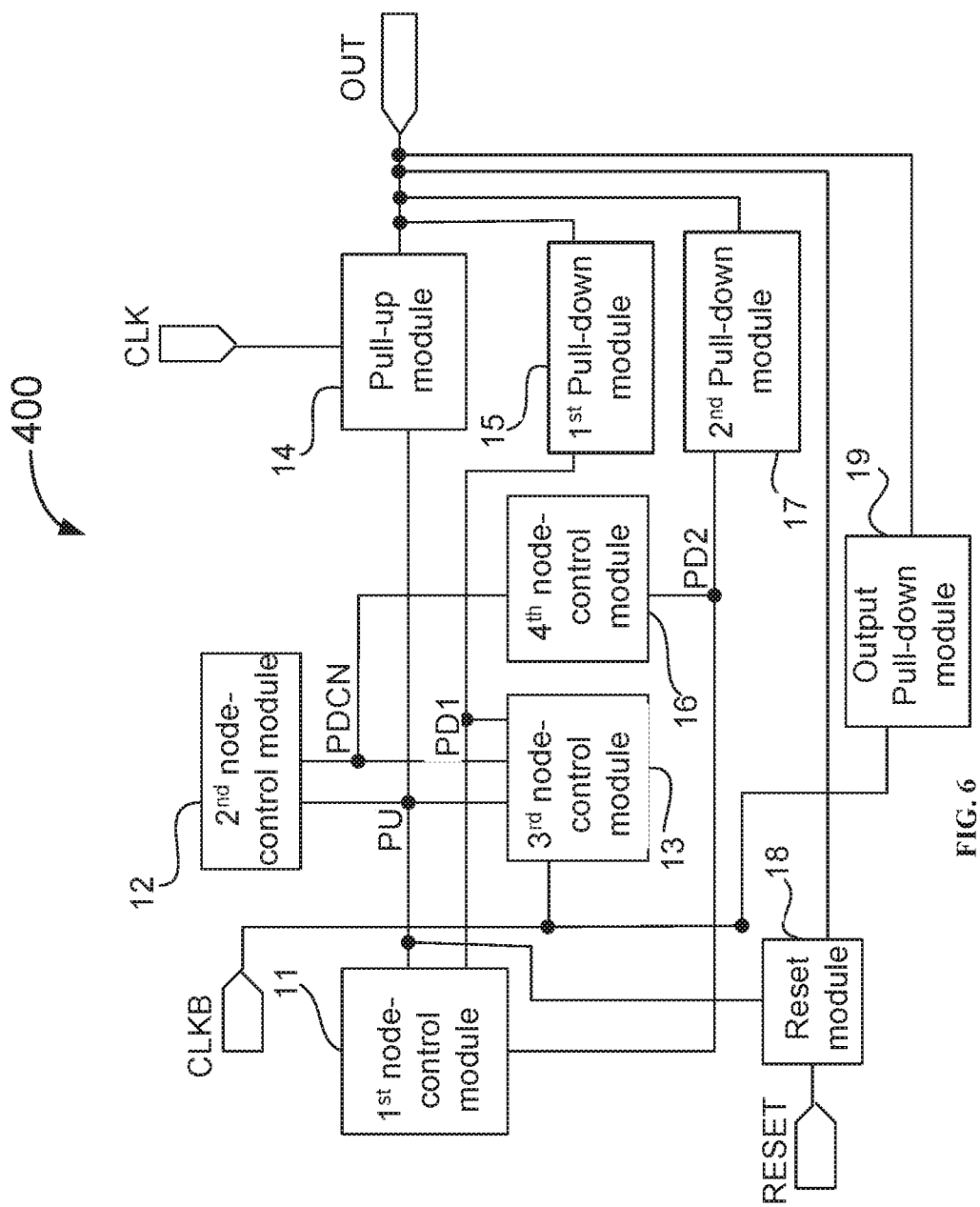
FIG. 6 is a block diagram of a shift register unit according to an alternative embodiment of the present disclosure.

FIG. 6 is a block diagram of a shift register unit according to an alternative embodiment of the present disclosure. In some alternative embodiments, the present disclosure provides a shift register unit 400 configured substantially similar to the shift register unit 200 with some additional control circuits. Referring to FIG. 6, the shift register unit 400 further includes a reset circuit 1, respectively connected to a reset terminal provided with a RESET signal, the pull-up node PU, and the output terminal OUT. The reset circuit 18 is configured to control both the pull-up node PU and the output terminal OUT at the second potential level when the second clock signal CLKB is given the first potential level. The shift register unit 400 also includes an output pull-down circuit 19 respectively connected to the second input terminal provided with the second clock signal CLKB and the output terminal OUT for outputting the gate driving signal. The output pull-down circuit 19 is configured to control the output terminal to output the second potential level when the second clock signal CLKB is given the first potential level.

Referring to FIG. 6, the reset circuit 18 is used to reset the potential level of the pull-up node PU and the output terminal OUT by setting the RESET signal to the first potential level. The output pull-down circuit 19 is used to control the output terminal OUT to output the second potential level when the second clock signal CLKB is inputted from the second input terminal at the first potential level.

In some embodiments, the reset circuit 18 includes a tenth transistor having a gate receiving the RESET signal, a first terminal coupled to the pull-up node PU, and a second terminal provided with the second potential level. The reset circuit 18 additionally includes an eleventh transistor having a gate receiving the RESET signal, a first terminal coupled to the output terminal OUT, and a second terminal provided with the second potential level.

In some embodiments, the output pull-down circuit 19 includes a twelfth transistor having a gate coupled to the second input terminal provided with the second clock signal CLKB, a first terminal coupled to the output terminal OUT, and a second terminal provided with the second potential level.

In some embodiments, many control circuits in the shift register unit, as described above and rest part of the disclosure, include one or more transistors. These transistors can be provided as thin-film transistors, field-effect transistors, or other types of transistors having similar characteristics. In the specification of the current disclosure, for distinguishing two terminals other than a gate of each transistor, a first terminal may be called source terminal or simply a source, and a second terminal may be called drain terminal or simply a drain. These transistors can be either n-type transistors or p-type transistors based on their functional characteristics. In the current disclosure, n-type transistors are assigned for all the transistors in the association to all the control circuits in the shift register unit for illustration purposes.

Figure 7:
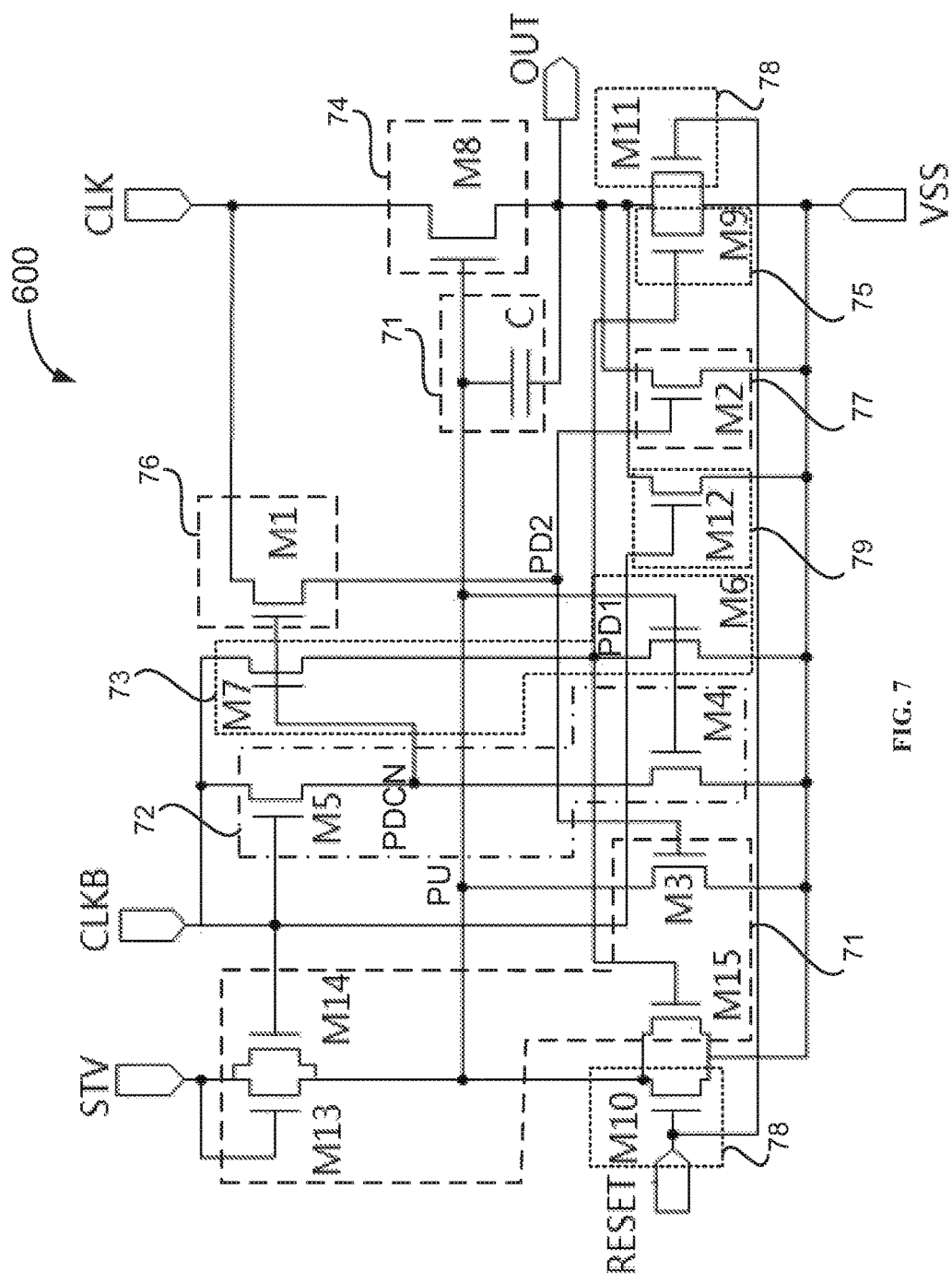
FIG. 7 is an exemplary circuit diagram of a shift register unit according to a specific embodiment of the present disclosure.

FIG. 7 is an exemplary circuit diagram of a shift register unit according to a specific embodiment of the present disclosure. Referring to FIG. 7, the shift register unit 600 is provided as an example of the shift register units 100, 200, 300, 300A, 300B, 400, respectively shown earlier in FIGS. 1-6. Specifically, the shift register unit 700 includes a pull-up node-control circuit 71, a pull-down-control-node control circuit 72, a first pull-down node-control circuit 73, a pull-up circuit 74, a first pull-down circuit 75, a second pull-down node-control circuit 76, a second pull-down circuit 77, a reset circuit 78, and an output pull-down circuit 79.

Referring to FIG. 7, the second pull-down node-control circuit 76, which is substantially the fourth node-control circuit described in FIGS. 1-6, includes a first transistor M1. The transistor M1 has a gate coupled to a pull-down control node PDCN, a drain coupled to a first input terminal provided with a first clock signal CLK, and a source coupled to a second pull-down node PD2.

Referring to FIG. 7, the second pull-down circuit 77 includes a second transistor M2 having a gate coupled to the second pull-down node PD2, a drain coupled to an output terminal OUT configured to output a gate driving signal, and a source provided with a low potential level VSS.

Referring to FIG. 7, the pull-up node-control circuit 71, which is just the first node-control circuit described in FIGS. 1-6, includes a third transistor M3. M3 has a gate connected to the second pull-down node PD2, a drain connected to the pull-up node PU, and a source connected to a power source of a low potential level VSS.

Referring to FIG. 7, the pull-down-control-node control circuit 72, which is simply described as the second node-control circuit in FIGS. 1-6, includes a fourth transistor M4 and a fifth transistor M5. M4 has a gate coupled to the pull-up node PU, a drain connected to the pull-down control node PDCN, and a source provided with the low potential level VSS. M5 has a gate and a drain commonly connected to a second input terminal for receiving a second clock signal CLKB. M5 also has a source connected to the pull-down control node PDCN.

Referring to FIG. 7, the first pull-down node-control circuit 73, which is substantially the third node-control circuit described, in FIGS. 1-6, includes a sixth transistor M6 and a seventh transistor M7. M6 has a gate coupled to the pull-up node PU, a drain coupled to the first pull-down node PD1, and a source provided with the low potential level VSS. M7 has a gate coupled to the pull-down control node PDCN, a drain coupled to a second input terminal provided with a second clock signal CLKB, and a source coupled to the first pull-down node PD1.

Referring to FIG. 7, the pull-up circuit 74 includes a eighth transistor M8 having a gate coupled to the pull-up node PU, a drain coupled to the first input signal provided with the first clock signal CLK, and a source coupled to the output terminal OUT for outputting a gate driving signal during an operation cycle of the shift register unit.

Referring to FIG. 7, the first pull-down circuit 75 includes a ninth transistor M9. M9 has a gate coupled to the first pull-down node PD1, a drain coupled to the output terminal OUT, and a source received a low potential level VSS.

Referring to FIG. 7, the reset circuit 78 includes a tenth transistor M10 and an eleventh transistor M11. M10 has a gate connected to a reset terminal to receive a RESET signal. M10 also has a drain connected to the pull-up node PU and a source provided with the low potential level VSS. M11 has a gate coupled to the reset terminal, a drain coupled to the output terminal OUT, and a source received the low potential level VSS.

Referring to FIG. 7, the output pull-down circuit 79 includes a twelfth transistor M12 having a gate connected to the second input terminal to receive the second clock signal CLKB, a drain connected to the output terminal OUT, and a source received the low potential level VSS.

Referring to FIG. 7, the first node-control circuit 71 further includes a thirteenth transistor M13, a fourteenth transistor M14, a fifteenth transistor M15, and a storage capacitor C. M13 has a gate and a drain commonly receiving a starting signal STV. M13 has a source coupled to the pull-up node PU. M14 has a gate receiving the second clock signal CLKB, a drain receiving the starting signal STV, and a source connected to the pull-up node PU. M15 has a gate coupled to the first pull-down node PD1, a drain connected to the pull-up node PU, and a source received the low potential level VSS. The storage capacitor C has a first terminal connected to the pull-up node PU and a second terminal connected to the output terminal OUT. As shown in FIG. 7, all transistors are n-type transistors, for mere illustration purpose. Optionally, all the transistors can be replaced with, partially or all, p-type transistors, provided that certain gate voltages may vary or set differently to control their on or off state without changing the claimed invention herein.

Figure 8:
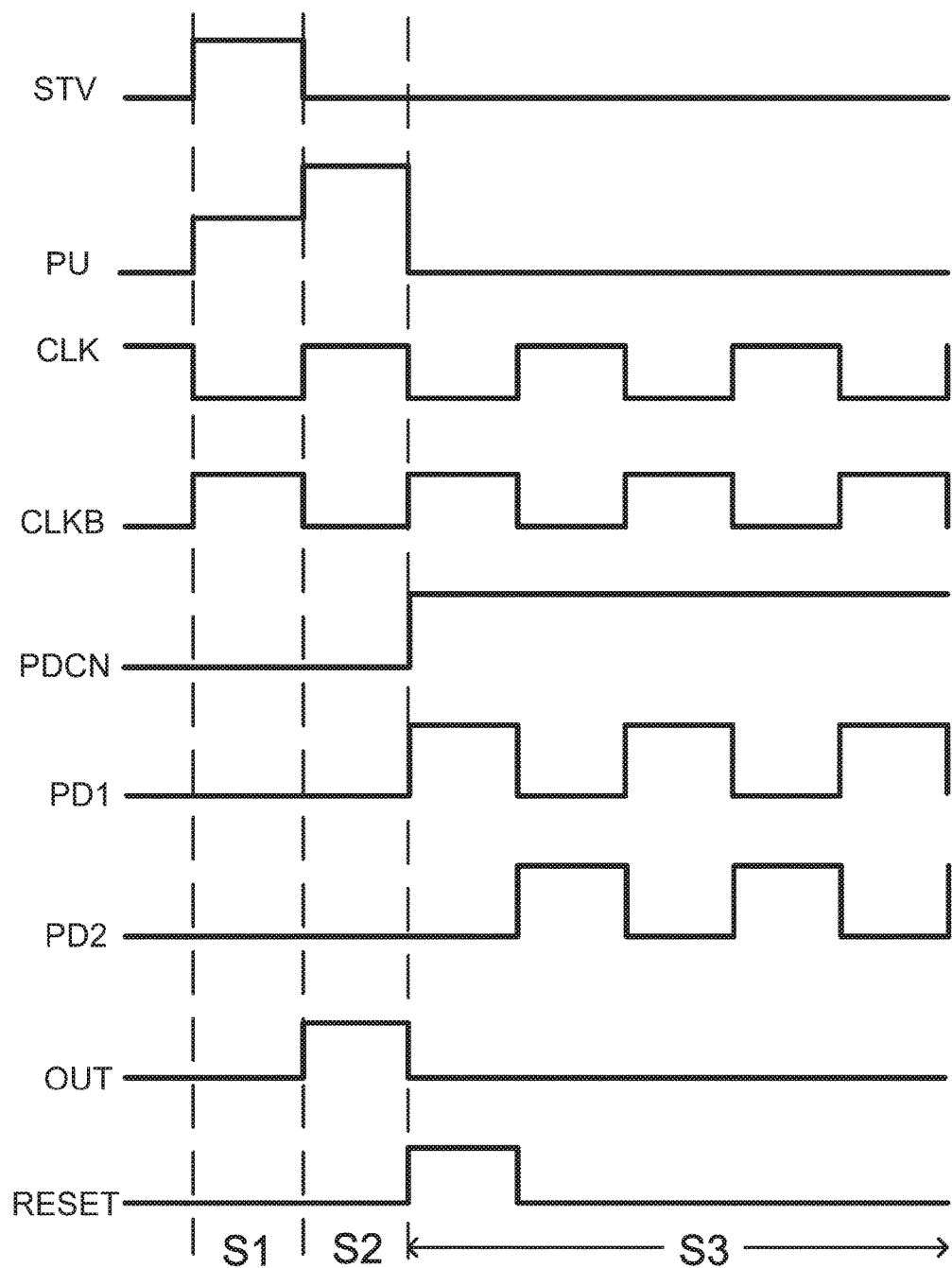
FIG. 8 is an operation timing diagram for driving the shift register unit of FIG. 7 according to an embodiment of the present disclosure.

FIG. 8 is an operation timing diagram for driving the shift register unit of FIG. 7 according to an embodiment of the present disclosure. Referring to FIG. 8, driving the shift register unit (of FIG. 7) is shown to carry out within one operation cycle for controlling a row of pixels for image display. Each operation cycle includes sequentially an input phase S1, an output phase S2, and an output-suspending phase S3.

In the input phase of each operation cycle, the starting signal STV is set to a high voltage level, which corresponds to the first potential level for turning on a transistor as described in the current disclosure for all shift register units, e.g., 100, 200, 300, 300A, 300B, 400, and 600. When STV is at the high voltage (turn-on) level, transistor M13 is in conduction state to pull up the pull-up node PU to a high potential level. Then, transistor M8 is turned on. But in this input phase S1, the first clock signal CLK is set to a low voltage level. So, the output terminal outputs a low voltage as the gate driving signal. Additionally, as the pull-up node PU is at the high potential level, transistors M4 and M6 are turned on. The pull-down control node PDCN and the first pull-down node PD1 are all at low potential level VSS, which corresponds to the second potential level for turning off a transistor as described in the current disclosure for all shift register units, e.g., 100, 200, 300, 300A, 300B, 400, and 600. As the node PDCN has a low potential level, the transistor M1 is turned off and the second pull-down node PD2 is also at the low potential level.

In the output phase S2 of each operation cycle, the second clock signal CLKB is provided at a low voltage level, correspondingly, the first clock signal is provided at a high voltage level. In this phase, the storage capacitor C is able to bootstrap the potential level at the pull-up node PU to push it to a potential level higher than the high potential level achieved in the input phase. Node PU maintains the higher potential level during the output phase. Transistor M8 is turned on. Since the CLK signal is at the high potential level, then, the output terminal is able to output high voltage signal as the gate driving signal in this phase. Additionally, as node PU still is at the high potential level, M4 and M6 keep in the conduction state and node PDCN and PD1 are set to low potential level VSS. M1 is also turned off, and the node PD2 has a low potential level.

In the output-suspending phase S3 of each operation cycle, it is divided into a beginning short period followed by subsequent long period. In the beginning short period of this phase, RESET signal is provided with a high voltage level. M10 and M11 are made to be in conduction states so as to pull down the potential levels of the pull-up node PU and the output terminal OUT to be the same as the low potential level VSS.

Referring to FIG. 8, from the beginning of the output-suspending phase S3, the pull-down control node PDCN is pulled up by transistor M5 to a high potential level. Transistor M7 is turned on to connect the node PD1 to the second clock signal CLKB, making the potential waveform of node PD1 varying the same way as that of second clock signal CLKB. Transistor M1 is turned on to connect the node PD2 to the first clock signal CLK, making the potential waveform of node PD2 varying the same way as that of first clock signal CLK. The first clock signal CLK and the second clock signal CLKB have an inverted phase of high and low potential levels. In the subsequent long period of S3, when node PD1 is at a low potential level, node PD2 then is at the high potential level. In this case, transistor M2 is turned on to control the output terminal to output a low voltage signal represented by VSS. Transistor M3 is turned on to control the pull-up node PU to be connected with the low potential level VSS. On one hand, when node PD1 is given a IOW potential level, node PD2 is able to help noise reduction in the output of node PU and the gate driving signal from the output terminal OUT. On the other hand, when node PD2 is given a low potential level, node PD1 becomes a high potential level to turn on M15 and M9 so as to help noise reduction in the output of node PU and the gate driving signal from the output terminal OUT.

In an alternative embodiment, the present disclosure provides a method of driving a shift register unit that is configured based on the descriptions through FIGS. 1-3. The method includes, in the output-suspending phase, controlling the second pull-down node potential level to be inverted in phase with the first pull-down node potential level by the pull-down control node controlled by the second node-control circuit. When the first pull-down node is given a first (high) potential level, the first pull-down circuit controls the output terminal to output the gate driving signal at a second (low) potential level. When the second pull-down node is given a first potential level, the first node-control circuit controls the pull-up node potential level at the second potential level and the second pull-down circuit controls the output terminal to output the gate driving signal at the second potential level.

In some embodiments, the method of driving the shift register unit includes using the fourth node-control circuit to control the second pull-down node potential level to be inverted in phase with the first pull-down node potential level during the output-suspending phase. When the first pull-down node is given a second potential level, the second pull-down node is at the first potential level. Then, the method includes using the first node-control circuit to set the pull-up node to the second potential level, and using the second pull-down circuit to control the output terminal to output the gate driving signal at the second potential level. In other words, during the output-suspending phase, both the pull-up node and the output terminal are set to the second potential level so that the signal noise are reduced for the pull-up node and the gate driving signal outputted from the output terminal.

In some embodiments, the method of driving a shift register unit further includes controlling the first pull-down node to a second potential level by a third node-control circuit when the pull-up node is given at a first potential level. Furthermore, the method includes controlling the first pull-down node to connect with a second input terminal provided with a second clock signal by the third node-control circuit when the pull-up node is at the second potential level. Moreover, the method includes controlling the pull-up node to the second potential level by the first node-control circuit when the first pull-down node is given the first potential level.

In some alternative embodiments, the current disclosure provides a gate driving circuit formed by cascading a plurality of shift register units in series and each of the plurality of shift register units is one of the as-described shift register units in FIGS. 1 through 7.

In some other alternative embodiments, the current disclosure also provides a display apparatus that contains the gate driving circuit as described above including a plurality of shift register units cascaded in series and each of the plurality of shift register units is one of the as-described shift register units in FIGS. 1 through 7 and is driven by a method based on the operation waveform described above in FIG. 8.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A shift register unit for outputting a gate driving signal to control image display in an operation cycle including sequentially an input phase, an output phase, an output-suspending phase, the shift register unit comprising:
    a first node-control circuit connected to a pull-up node and a first pull-down node;
    a second node-control circuit connected to a pull-down control node and the pull-up node;
    a pull-up circuit connected to the pull-up node, a first input terminal for receiving a first clock signal, and an output terminal for outputting the gate driving signal, and configured to control the first clock signal to be passed from the first input terminal to the output terminal when the pull-up node is at a first potential level;
    a third node-control circuit connected to the pull-up node, the first pull-down node, the pull-down control node, and a second input terminal for receiving a second clock signal; and configured to control the first pull-down node to receive the second clock signal from the second input terminal when the pull-down control node is at the first potential level;
    a first pull-down circuit connected to the first pull-down node and the output terminal to control a second potential level to be passed to the output terminal when the first pull-down node is at the first potential level;
    a fourth node-control circuit connected to a second pull-down node and the pull-down control node to control the second pull-down node at the second potential level during the input phase and the output phase and to maintain an inverted potential level between the second pull-down node and the first pull-down node during the output-suspending phase; and
    a second pull-down circuit connected to the second pull-down node and the output terminal to yield a second potential level at the output terminal when the second pull-down node is at the first potential level, wherein the first node-control circuit is further connected to the second pull-down node to control the pull-up node at the second potential level when the second pull-down node is at the first potential level.

2. The shift register unit of claim 1, wherein the first node-control circuit is configured to control the pull-up node at the first potential level during the input phase and the output phase, to control the pull-up node at the second potential level during the output-suspending phase, and to control the pull-up node at the second potential level when the first pull-down node is at the first potential level.

3. The shift register unit of claim 1, wherein the third node-control circuit is configured to control the first pull-down node at the second potential level when the pull-up node is at the first potential level and to control the first pull-down node to connected to the second input terminal when the pull-down control node is at the first potential level.

4. The shift register unit of claim 3, wherein the third node-control circuit comprises:
    a sixth transistor having a gate coupled to the pull-up node, a first terminal coupled to the first pull-down node, and a second terminal provided with the second potential level; and
    a seventh transistor having a gate coupled to the pull-down control node, a first terminal coupled to the second input terminal for receiving the second clock signal, and a second terminal coupled to the first pull-down node.

5. The shift register unit of claim 1, wherein the second node-control circuit is configured to control the pull-down control node at the second potential level when the pull-up node is at the first potential level, and to control the pull-down control node at the first potential level when the pull-up node is at the second potential level, and to connect with the first input terminal for receiving the first clock signal with an inverted phase of the second clock signal.

6. The shift register unit of claim 1, wherein the fourth node-control circuit is connected to the first input terminal for receiving the first clock signal configured to be inverted in phase with the second clock signal, and is configured to control the first clock signal to be passed to the second pull-down node when the pull-down control node is at the first potential level and to control the second pull-down node at the second potential level when the pull-down control node is at the second potential level.

7. The shift register unit of claim 1, wherein the fourth node-control circuit comprises a first transistor having a gate coupled to the pull-down control node, a first terminal coupled to the first input terminal, and a second terminal coupled to the second pull-down node.

8. The shift register unit of claim 1, wherein the second pull-down circuit comprises a second transistor having a gate coupled to the second pull-down node, a first terminal coupled to the output terminal, and the second terminal provided with the second potential level.

9. The shift register unit of claim 1, wherein the first node-control circuit comprises a third transistor having a gate coupled to the second pull-down node, a first terminal coupled to the pull-up node, and a second terminal provided with the second potential level.

10. The shift register unit of claim 1, wherein the second node-control circuit comprises a fourth transistor and a fifth transistor, the fourth transistor having a gate coupled to the pull-up node, a first terminal coupled to the pull-down control node, and a second terminal provided with the second potential level, the fifth transistor having a gate and a first terminal commonly coupled to the second input terminal for receiving the second clock signal and a second terminal coupled to the pull-down control node.

11. The shift register unit of claim 1, wherein the pull-up circuit comprises an eighth transistor having a gate coupled to the pull-up node, a first terminal coupled to the first input terminal for receiving the first clock signal, and a second terminal coupled to the output terminal for outputting the gate driving signal; and
    the first pull-down circuit comprises a ninth transistor having a gate coupled to the first pull-down node, a first terminal coupled to the output terminal, and the second terminal provided with the second potential level.

12. The shift register unit of claim 1, further comprising:
a reset circuit respectively connected to a reset terminal, the pull-up node, and the output terminal, and configured to control the pull-up node and the output terminal to be at the second potential level when the reset terminal is at the first potential level; and
an output pull-down circuit respectively connected to the second input terminal, and the output terminal, and configured to control the output terminal for outputting the second potential level when the second clock signal is at the first potential level.

13. The shift register unit of claim 12, wherein the reset circuit comprises a tenth transistor and an eleventh transistor, the tenth transistor having a gate connected to the reset terminal for receiving a reset signal, a first terminal connected to the pull-up node, and a second terminal provided with the second potential level, the eleventh transistor having a gate connected to the reset terminal for receiving the reset signal, a first terminal connected to the output terminal, and a second terminal provided with the second potential.

14. The shift register unit of claim 12, wherein the output pull-down circuit comprises a twelfth transistor having a gate connected to the second input terminal for receiving the second clock signal, a first terminal connected to the output terminal, and a second terminal provided with the second potential level.

15. A gate driving circuit comprising a plurality of shift register units of claim 14.

16. A display apparatus comprising a gate driving circuit of claim 15.

17. The shift register unit of claim 12, wherein the first node-control circuit further comprises:
a thirteenth transistor having a gate and a first terminal commonly provided with a starting signal and a second terminal connected to the pull-up node;
a fourteenth transistor having a gate connected to the second input terminal for receiving the second clock signal, a first terminal provided with the starting signal, and a second terminal connected to the pull-up node;
a fifteenth transistor having a gate connected to the first pull-down node, a first terminal connected to the pull-up node, and a second terminal provided with the second potential level; and
a storage capacitor having a first terminal connected to the pull-up node and a second terminal connected to the output terminal.

18. A method for driving the shift register unit of claim 17 in an operation cycle including sequentially an input phase, and an output-suspending phase, the method comprising:
in the input phase, setting the starting signal to a high voltage level to pass the high voltage level to the pull-up node, setting the first clock signal to a low voltage level to be passed from the first input signal to the output terminal, and making the pull-down control node, the first pull-down node, and the second pull-down node at the low voltage level;

in the output phase, setting the first clock signal at a high voltage level and the second clock signal with an inverted phase at a low voltage level, bootstrapping the pull-up node to a higher level than the high voltage level achieved in the input phase so as to pass the high voltage level of the first clock signal to the output terminal, and keeping the pull-down control node, the first pull-down node, and the second pull-down node at the low voltage level; and in the output-suspending phase, controlling the second pull-down node potential level to be inverted in phase with the first pull-down node potential level by the pull-down control node controlled by the second node-control circuit, wherein the first pull-down circuit controls the output terminal to output the gate driving signal at a second potential level when the first pull-down node is given a first potential level, wherein the first node-control circuit controls the pull-up node potential level at the second potential level and the second pull-down circuit controls the output terminal to output the gate driving signal at the second potential level when the second pull-down node is given a first potential level.

19. The method of claim 18, further comprising:
controlling the first pull-down node to a second potential level by a third node-control circuit when the pull-up node is given at a first potential level;
controlling the first pull-down node to connect with a second input terminal provided with a second clock signal by the third node-control circuit when the pull-up node is at the second potential level; and
controlling the pull-up node to the second potential level by the first node-control circuit when the first pull-down node is given the first potential level.

20. The method of claim 19, further comprising:
setting the reset signal to a high voltage level for a short period in the output-suspending phase to pass a low voltage level to the pull-up node, the second potential level is substantially the low voltage level; and
maintaining the first clock signal from the first input terminal and the second clock signal from the second input terminal alternatively at the first potential level and the second potential level with an inverted phase during the output-suspending phase.

* * * * *